(12) United States Patent
Ku

(10) Patent No.: US 7,183,631 B2
(45) Date of Patent: Feb. 27, 2007

(54) PACKAGE STRUCTURE MODULE OF BUMP POSITED TYPE LEAD FRAME

(75) Inventor: Hsiao-Tung Ku, Kaoshiung Hsien (TW)

(73) Assignee: Richtek Technology Corp., Hsinchu Hsien (TW)

(*) Notice: Subject to any disclaimer, the term of this patent is extended or adjusted under 35 U.S.C. 154(b) by 108 days.

(21) Appl. No.: 10/968,187

(22) Filed: Oct. 20, 2004

(65) Prior Publication Data
US 2006/0081969 A1  Apr. 20, 2006

(51) Int. Cl.
*H01L 23/495* (2006.01)
(52) U.S. Cl. ............................. 257/666; 257/737
(58) Field of Classification Search ................ 257/778, 257/737, 666, 723
See application file for complete search history.

(56) References Cited

U.S. PATENT DOCUMENTS 5,849,608 A * 12/1998 Abe ..................... 438/123
6,388,336 B1 * 5/2002 Venkateshwaran et al. . 257/779

* cited by examiner

*Primary Examiner*—Roy Karl Potter
(74) *Attorney, Agent, or Firm*—Birch Stewart Kolasch & Birch,LLP

(57) ABSTRACT

A package structure that uses a bump posited type lead frame is disclosed. The package structure uses a lead frame having holes thereon for accommodating conductive bumps of a chip or a positioning film having openings thereon for accommodating conductive bumps of a chip or both to avoid the flow and deformation of the conductive bumps during bonding so as to prevent the electrical property of the package structure from degradation and increase the reliability of the chip package.

10 Claims, 5 Drawing Sheets

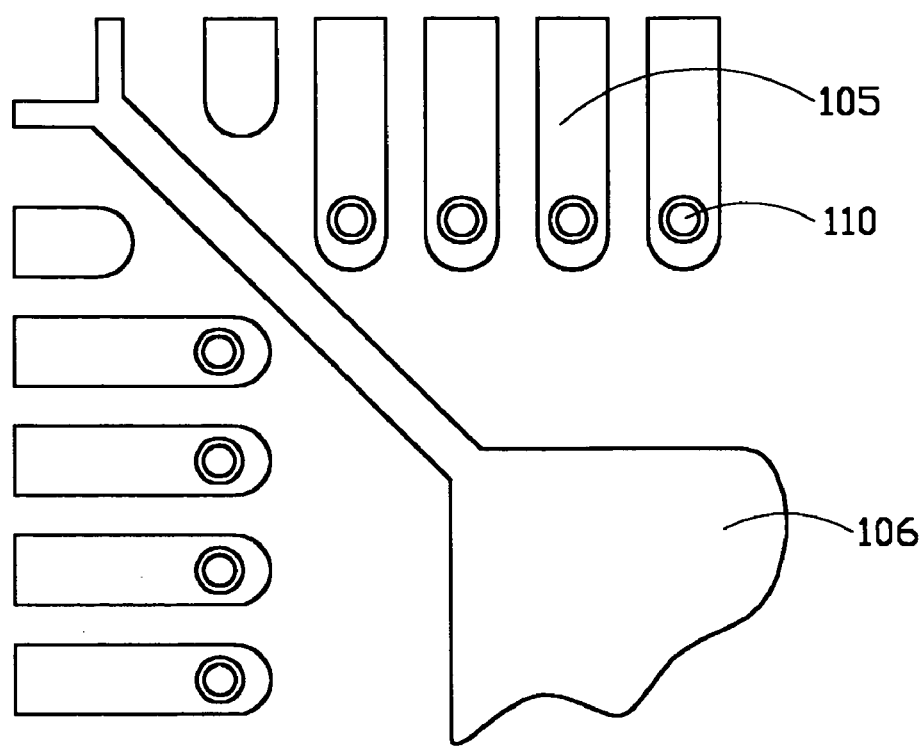
FIG.5A
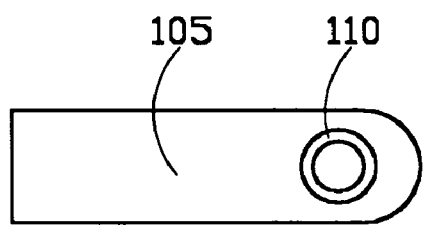
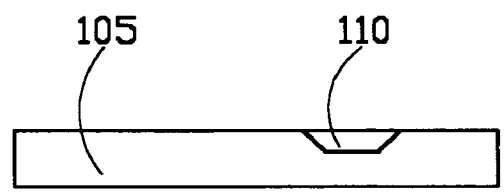
FIG.5B
FIG.5C

PACKAGE STRUCTURE MODULE OF BUMP POSITED TYPE LEAD FRAME

BACKGROUND OF THE INVENTION

1. Field of the Invention

The present invention relates to a lead frame package structure, and more particularly to a package structure module of bump posited type lead frame.

2. Description of the Related Art

Owing to the demands and availability of electronic products with multifunction as well as the development of semiconductor technology, the package technologies of advanced commercial semiconductor devices must advance toward simplified processes, minimized structure size, high integration, strengthened electrical connection and high thermal conductivity from conventional package processes, large-size structure and limited electrical characteristics. For lead frame package technologies, conventional lead frame packages which bond a chip having bumps onto a lead frame with pre-plated silver thereon to complete electrical connection and to form a flip chip package structure have several drawbacks. For example, positioning and bonding of the bumps onto the lead frame usually lack accuracy so that the electrical connection and package reliability are degraded and the yield ratio is also decreased. Moreover, even the positioning of the bumps dose not cause any bonding issue, due to the wettability and fluidity of the bumps, the bumps still could be bonded onto the lead frame inaccurately so as to result in the degradation of electrical property of the package structure.

In view of the drawbacks mentioned with the prior art, there is a continued need to develop new and improved package structure that overcomes the disadvantages associated with prior art. The requirements of this invention are that it solves the problems mentioned above.

BRIEF SUMMARY OF THE INVENTION

It is therefore an object of the invention to provide a package structure with pre-etched holes formed on leads of a lead frame used as bump positioning and bonding to avoid the degradation of electrical property resulting from the dislocations of chip bumps and increase the reliability of the chip package.

It is another object of this invention to provide a package structure with a positioning film on a lead frame used as bump positioning to avoid the degradation of electrical property resulting from the dislocation of chip bumps and increase the reliability and life time of the chip package.

It is a further object of this invention to provide a package structure with pre-etched holes formed on leads of a lead frame and a positioning film on the lead frame used as bump positioning and bonding to avoid the degradations of chip bumps and increase the reliability and life time of the chip package.

To achieve these objects, and in accordance with the purpose of the invention, the invention provides a package structure comprising a chip having conductive bumps and a lead frame having holes thereon for accommodating the conductive bumps, the chip bonds to the lead frame via the conductive bumps.

In one embodiment of the invention, the package structure comprises a chip having conductive bumps and a lead frame, and a positioning film on the lead frame, the chip bonds to the lead frame via the conductive bumps, the positioning film having openings for accommodating the conductive bumps.

In another embodiment of the invention, the package structure comprises a chip having conductive bumps, a lead frame having holes thereon for accommodating the conductive bumps and a positioning film on the lead frame, the chip bonds to the lead frame via the conductive bumps, the positioning film have openings for accommodating the conductive bumps, each the opening is superimposed on each the hole.

The invention also provides a lead frame module of a package structure comprising a lead frame comprising leads having holes thereon for accommodating conductive bumps of a chip and a positioning film on the lead frame, the chip bonds to the lead frame via the conductive bumps; the positioning film have openings for accommodating the conductive bumps, each the opening is superimposed on each the hole.

It is to be understood that both the foregoing general description and the following detailed description are exemplary and explanatory only and are not restrictive of the invention, as claimed.

BRIEF DESCRIPTION OF THE DRAWINGS

The present invention is best understood by reference to the following detailed description when read in conjunction with the accompanying drawings.

FIG. 5A shows a top view of a corner of the lead frame corresponding to the first and second embodiment of the invention; and FIG. 5B and 5C show a top view and a cross sectional view of only one lead having one hole thereon respectively.

Common reference numerals are used throughout the drawings and detailed description to indicate like elements.

DETAILED DESCRIPTION OF THE INVENTION

Figure 1:
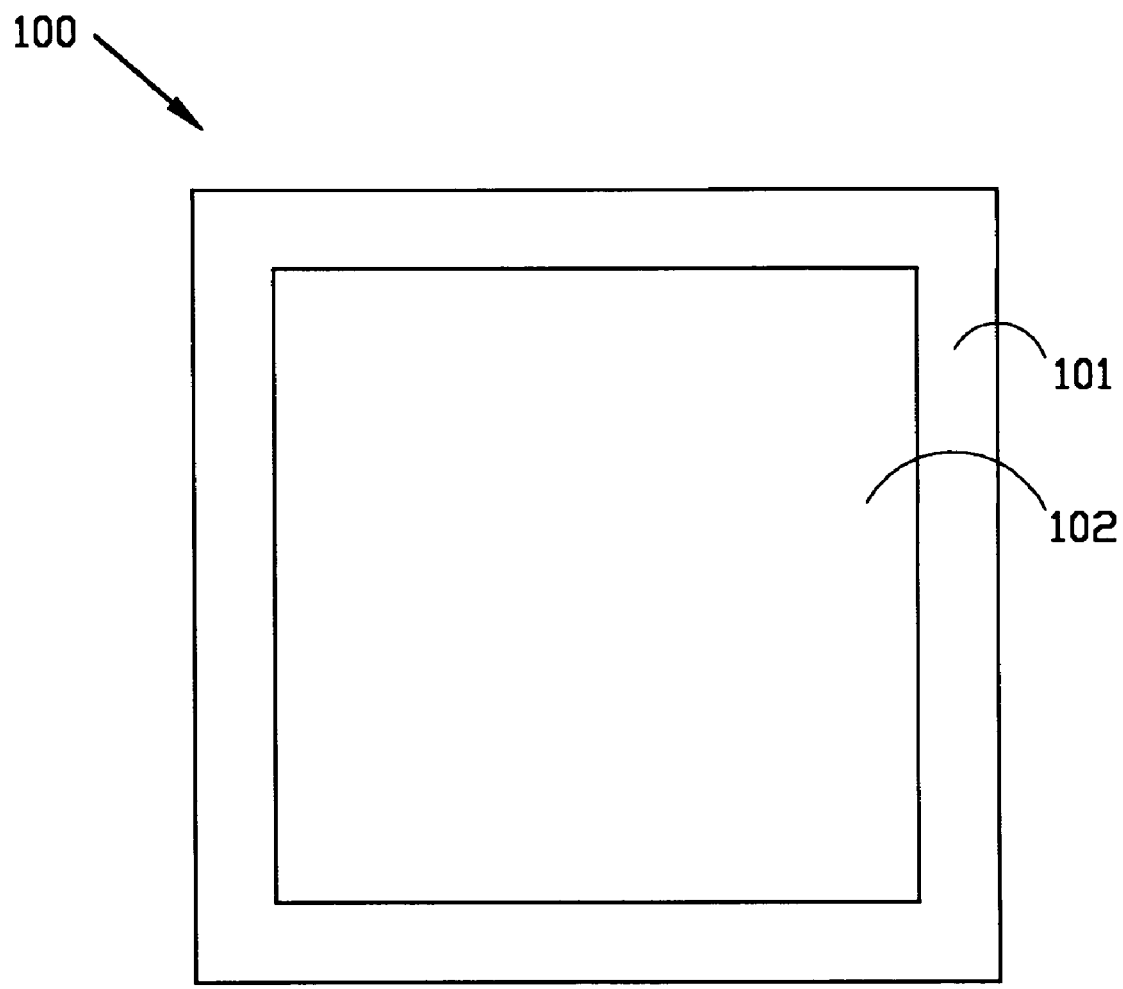
FIG. 1 shows a top view of a package structure.

Referring to FIG. 1, a top view of a package structure 100 is shown. In this top view of the package structure 100, a protecting dielectric material 101 and a chip 102 are shown. The protecting dielectric material 101 comprises a molding compound, but other dielectric material can also be used. Based on the package structure 100 shown in FIGS. 1, three embodiments of the package structure of the invention are shown in FIGS. 2A–2B, 3A–3B and 4A–4B.

Figure 2A:
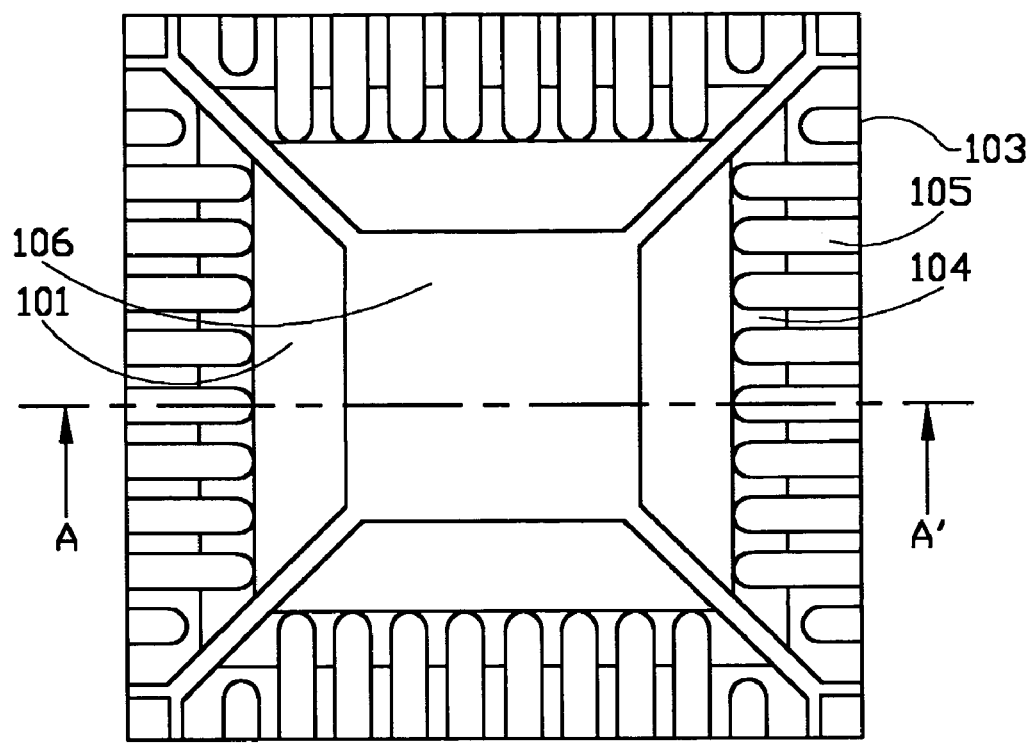
FIG. 2A shows a bottom view of the first embodiment of the package structure.
Figure 2B:
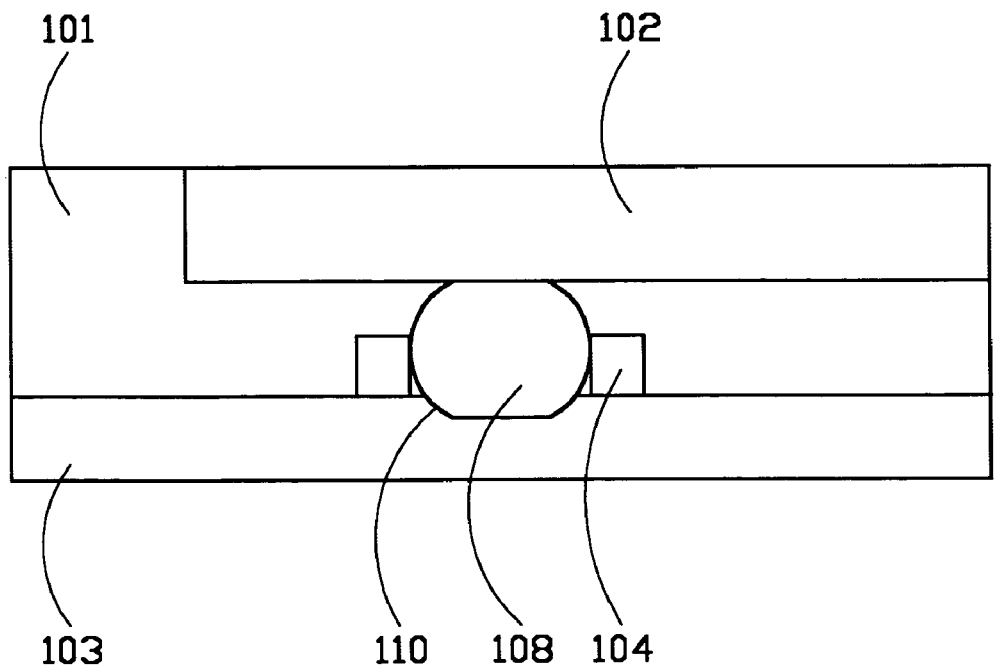
FIG. 2B shows a cross sectional view of the first embodiment of the package structure of the invention.

Referring to FIG. 2A, a bottom view of the first embodiment of the package structure 100 is shown. In this bottom view of the package structure 100, a lead frame 103 and a positioning film 104 as well as the protecting dielectric material 101 are shown. The lead frame 103 comprises leads 105 and a die attach pad 106. FIG. 2B shows a cross sectional view of the first embodiment of the package structure of the invention. Particularly, FIG. 2B shows a cross sectional view of the left portion of the package structure 100 shown in FIG. 1 and FIG. 2A. In this embodiment, the chip 102 bonds onto the lead frame 103 via conductive bumps 108. The leads of the lead frame 103 have holes 110 for positing the bumps 108. The number and location of the holes 110 on the lead frame 103 depend on the number and position of the bumps 108 of the chip 102. For example, each hole 110 can be formed on each lead 105. The positioning film 104 also has openings superimposed on the hole 110 and the openings are used to fix the bumps 108 so as to prevent the bumps 108 from deformation. The protecting dielectric material 101 is formed between the chip 102 and the lead frame 103. The holes 110 of the lead frame 103 and the openings of the positioning film 104 are used to avoid the flow and deformation of the bumps 108 during bonding so as to prevent the electrical property from degradation and increase the reliability of the chip package.

Figure 3A:
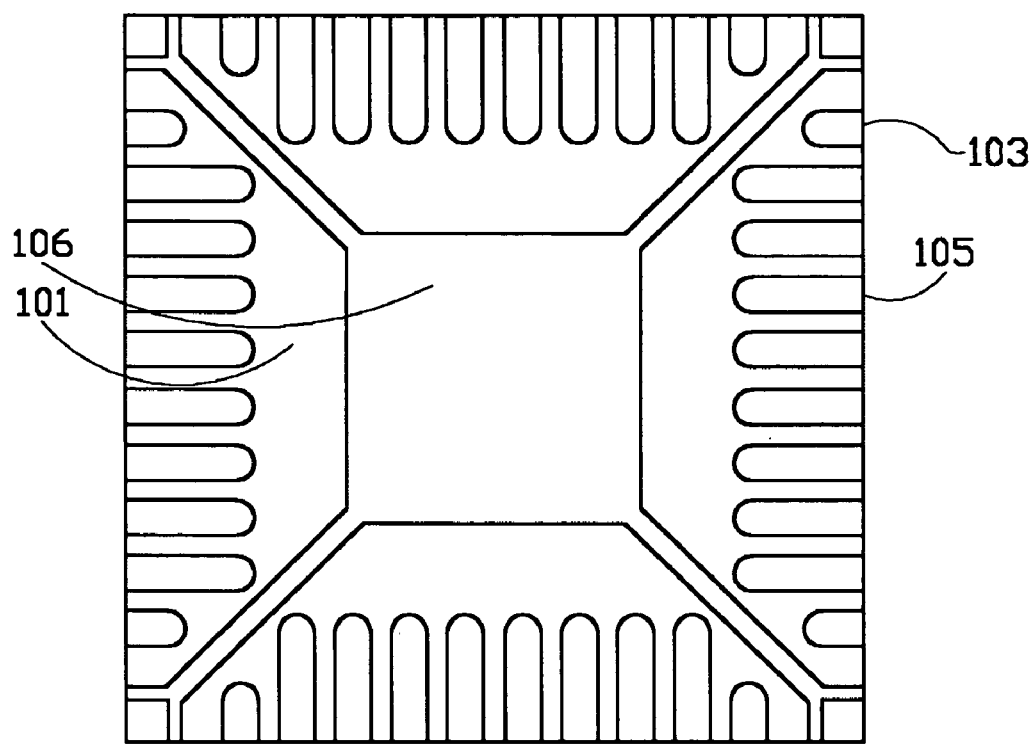
FIG. 3A shows a bottom view of the second embodiment of the package structure.
Figure 3B:
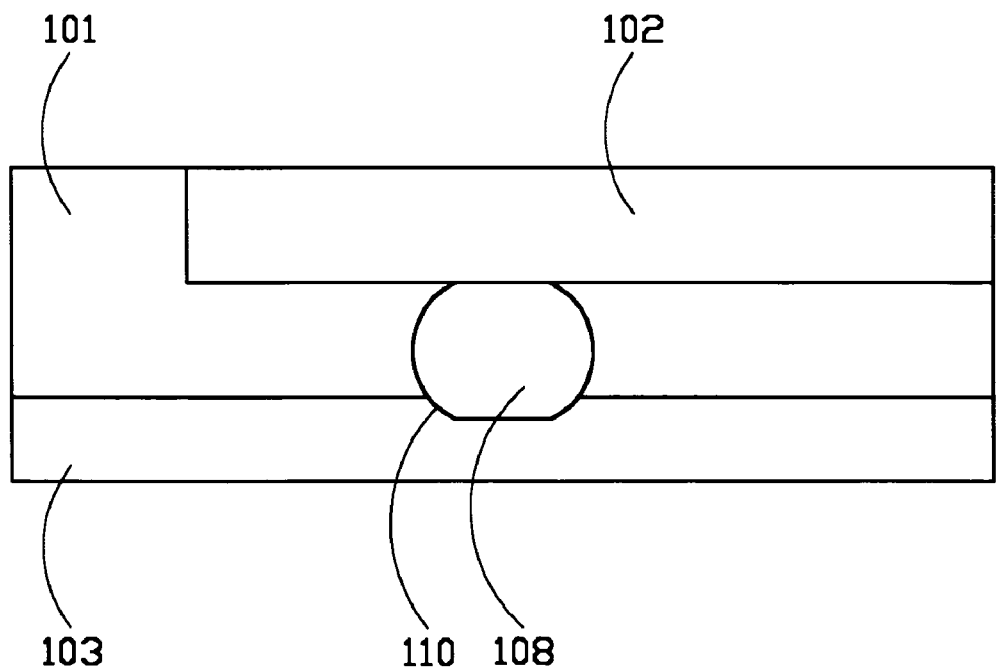
FIG. 3B shows a cross sectional view of the second embodiment of the package structure of the invention.

Referring to FIG. 3A, a bottom view of the second embodiment of the package structure 100 is shown. In this bottom view of the package structure 100, the lead frame 103 and the protecting dielectric material 101 are shown. The lead frame 103 comprises leads 105 and the die attach pad 106. FIG. 3B shows a cross sectional view of the second embodiment of the package structure of the invention. FIG. 3B particularly shows a cross sectional view of the left portion of the package structure 100 shown in FIG. 1 and FIG. 3A. In this embodiment, the chip 102 bonds onto the lead frame 103 via conductive bumps 108. The leads of the lead frame 103 have holes 110 for positing the bumps 108. The number and location of the holes 110 on the lead frame 103 depend on the number and position of the bumps 108 of the chip 102. For example, each hole 110 can be formed on each lead 105. The protecting dielectric material 101 is formed between the chip 102 and the lead frame 103. The holes 110 of the lead frame 103 are used to avoid the flow and deformation of the bumps 108 during bonding so as to prevent the electrical property from degradation and increase the reliability of the chip package.

Figure 4A:
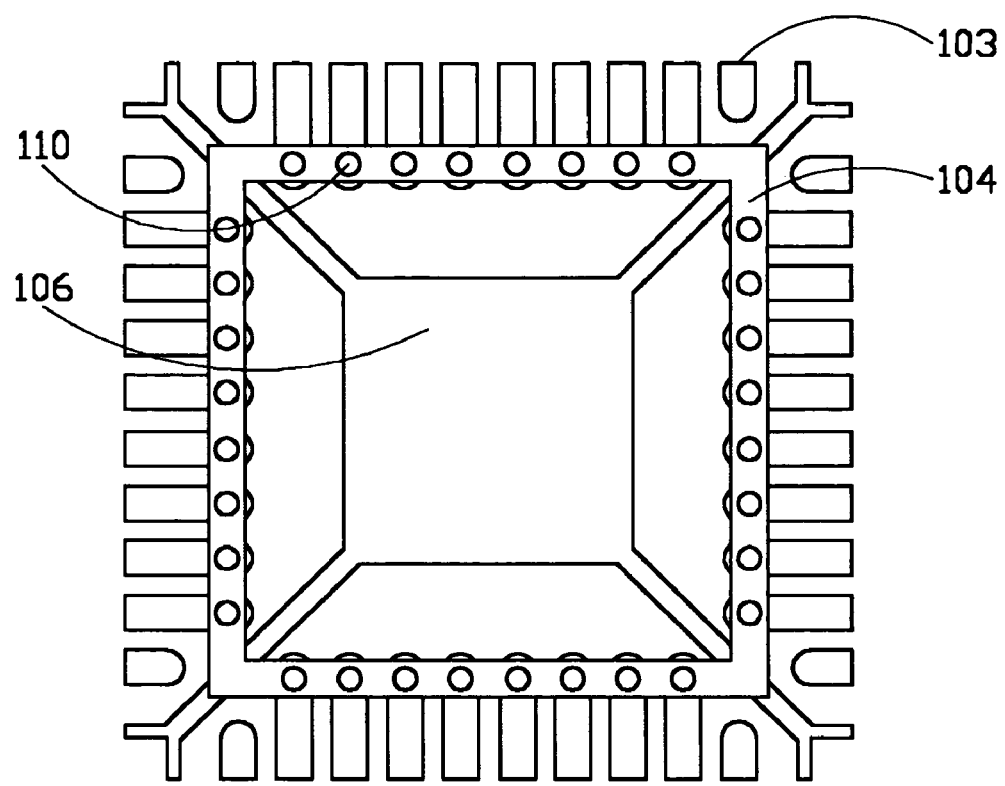
FIG. 4A shows a view of the third embodiment of the package structure.
Figure 4B:
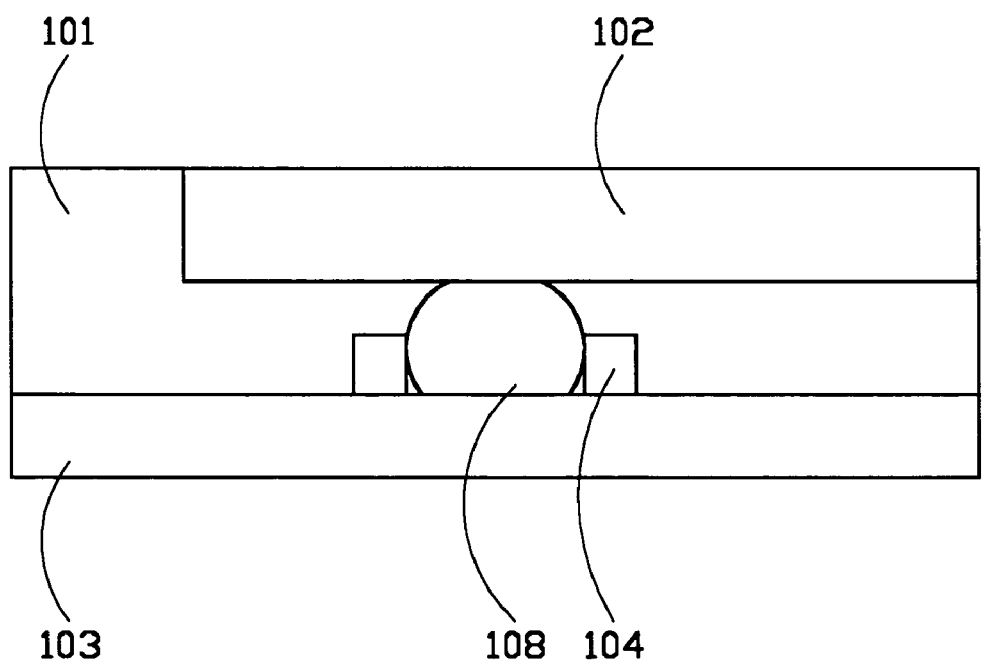
FIG. 4B shows a cross sectional view of the third embodiment of the package structure of the invention.

Referring to FIG. 4A, a view of the third embodiment of the package structure 100 is shown. In this view of the package structure 100, the lead frame 103 and the positioning film 104 are shown while the chip 102 and the protecting dielectric material 101 are not shown. The lead frame 103 comprises leads 105 and the die attach pad 106. FIG. 4B shows a cross sectional view of the third embodiment of the package structure of the invention. Particularly, FIG. 4B shows a cross sectional view of the left portion of the package structure 100 shown in FIG. 1 and FIG. 4A. In this embodiment, the chip 102 bonds onto the lead frame 103 via conductive bumps 108. The positioning film 104 has openings superimposed on the lead frame 103 and the openings are used to fix the bumps 108 so as to prevent the bumps 108 from deformation. The number and location of the openings on the positioning film 104 depend on the number and position of the bumps 108 of the chip 102. The protecting dielectric material 101 is formed between the chip 102 and the lead frame 103. The openings of the positioning film 104 are used to avoid the flow and deformation of the bumps 108 during bonding so as to prevent the electrical property from degradation and increase the reliability of the chip package.

Referring to FIG. 5A, a top view of a corner of the lead frame 103 corresponding to the first and second embodiment of the invention is shown. As shown in FIG. 5A, each hole 110 is formed on each lead 105. FIG. 5B and 5C show a top view and a cross sectional view of only one lead 105 having one hole 110 thereon respectively.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A package structure comprising:
   a chip having conductive bumps; and
   a lead frame having a die attach pad, leads and holes on said leads for accommodating said conductive bumps, said chip bonds to said lead frame via said conductive bumps.

2. The package structure according to claim 1 further comprising a protecting dielectric material.

3. The package structure according to claim 2, wherein said protecting dielectric material comprises a molding compound.

4. A package structure comprising:
   a chip having conductive bumps;
   a lead frame having a die attach pad and leads, said chip bonds to said lead frame via said conductive bumps; and
   a positioning film on said lead frame, said positioning film having openings for accommodating said conductive bumps, said openings are superimposed on said leads.

5. The package structure according to claim 4 further comprising a protecting dielectric material.

6. The package structure according to claim 5, wherein said protecting dielectric material comprises a molding compound.

7. A package structure comprising:
   a chip having conductive bumps;
   a lead frame having a die attach pad, leads and holes on said leads for accommodating said conductive bumps, said chip bonds to said lead frame via said conductive bumps; and
   a positioning film on said lead frame, said positioning film have openings for accommodating said conductive bumps, each said opening is superimposed on each said hole.

8. The package structure according to claim 7 further comprising a protecting dielectric material.

9. The package structure according to claim 8, wherein said protecting dielectric material comprises a molding compound.

10. A lead frame module of a package structure comprising:
    a lead frame comprising leads having holes thereon for accommodating conductive bumps of a chip, said chip bonds to the lead frame via said conductive bumps; and
    a positioning film on said lead frame, said positioning film have openings for accommodating said conductive bumps, each said opening is superimposed on each said hole.

* * * * *